(12) United States Patent
Bucksch et al.

(10) Patent No.: US 7,184,339 B2
(45) Date of Patent: Feb. 27, 2007

(54) SEMI-CONDUCTOR COMPONENT, AS WELL AS A PROCESS FOR THE IN- OR OUTPUT OF TEST DATA

(75) Inventors: Thorsten Bucksch, München (DE); Martin Perner, München (DE); Volker Kilian, München (DE); Martin Meier, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/253,807

(22) Filed: Oct. 20, 2005

(65) Prior Publication Data

US 2006/0087900 A1  Apr. 27, 2006

(30) Foreign Application Priority Data

Oct. 21, 2004  (DE) .................... 10 2004 051 345

(51) Int. Cl.
*G11C 29/00* (2006.01)
(52) U.S. Cl. .................... 365/201; 365/230.08
(58) Field of Classification Search ................ 365/201, 365/189.12, 230.03, 230.08
See application file for complete search history.

(56) References Cited

U.S. PATENT DOCUMENTS 4,951,254 A   8/1990  Ontrop
5,905,690 A   5/1999  Sakurai
7,095,661 B2 * 8/2006  Osaka et al. ................ 365/194

FOREIGN PATENT DOCUMENTS

DE   19743001 A1   4/1999
DE   10110627 A1   9/2002

OTHER PUBLICATIONS

Windeck, C. (2000). "Speicherriegel Enträtselt: Wie Mainboards die Hauptspeicher-Zeitparameter Einstellen (sollten)," *Know-how—SDRAM-Speichermodule* 17:166-173.

* cited by examiner

*Primary Examiner*—Vu A. Le
(74) *Attorney, Agent, or Firm*—Morrison & Foerster LLP

(57) ABSTRACT

The invention relates to a semi-conductor component, and a process for the in- and/or output of test data and/or semi-conductor component operating control data into or from a semi-conductor component, whereby the semi-conductor component comprises one or more useful data memory cells, and/or one or more test data and/or semi-conductor component operating control data registers for storing test data and/or semi-conductor component operating control data, and whereby the process comprises the steps of applying a control signal to the semi-conductor component, whereby the semi-conductor component is switched from a first to a second operating mode; and applying an address signal to the semi-conductor component, whereby one or more of the test data and/or semi-conductor component operating control data registers of the semi-conductor component is addressed by the address signal in the second operating mode, and one or more of the useful data memory cells in the first operating mode.

10 Claims, 4 Drawing Sheets

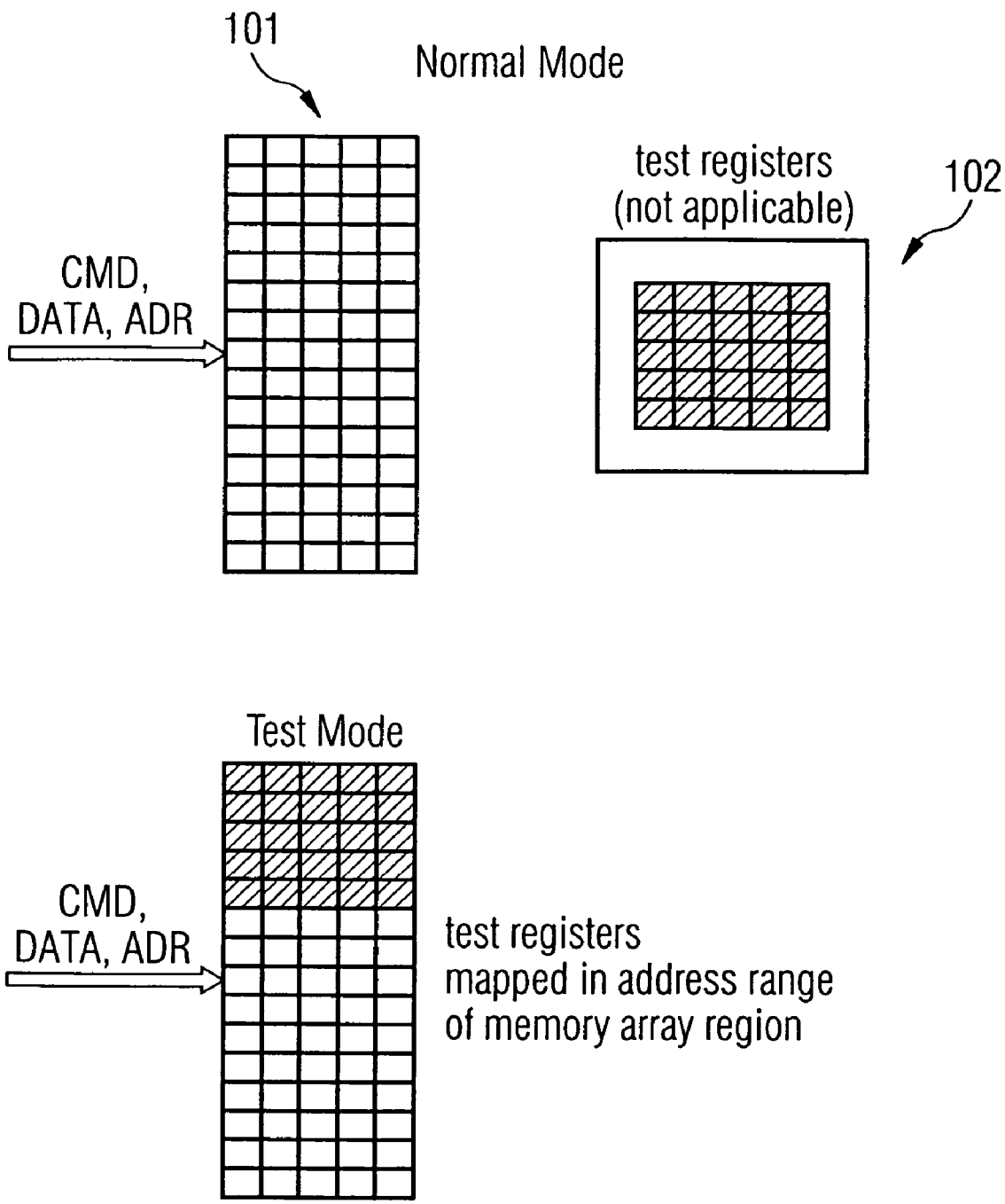

SEMI-CONDUCTOR COMPONENT, AS WELL AS A PROCESS FOR THE IN-OR OUTPUT OF TEST DATA

CLAIM FOR PRIORITY

This application claims the benefit of priority to German Application No. 10 2004 051 345.7 which was filed in the German language on Oct. 21, 2004, the contents of which are hereby incorporated by reference.

TECHNICAL FIELD OF THE INVENTION

The invention relates to a semi-conductor component, as well as to a process for the in- or output of test data.

BACKGROUND OF THE INVENTION

Semi-conductor components, e.g. corresponding integrated (analog and/or digital) computing circuits, semi-conductor memory components such as for instance function memory components (PLAs, PALs, etc.) and table memory components (e.g. ROMs or RAMs, particularly SRAMs and DRAMs), etc. are subjected to numerous tests in the course of the manufacturing process.

For the simultaneous manufacture of a plurality of (generally identical) semi-conductor components, a so-called wafer (i.e. a thin disk consisting of monocrystalline silicon) is used. The wafer is appropriately processed (e.g. subjected to numerous of coating, lighting, etching, diffusion implantation process steps, etc.), and subsequently sawn up (or e.g. scored and snapped off), so that the individual components are made available.

During the manufacture of semi-conductor components (e.g. DRAMs (Dynamic Random Access Memories and/or dynamic Read/Write memories), particularly of DDR-DRAMs (Double data Rate-DRAMs and/or DRAMs with double data rate)) the components (still on the wafer and incomplete) may be subjected to corresponding test procedures (e.g. so-called kerf measurements at the scoring grid) even before all the required above processing steps have been performed on the wafer (i.e. even while the semi-conductor components are still semi-complete) at one or several test stations by means of one or several test apparatuses.

After the semi-conductor components have been completed (i.e. after all the above wafer processing steps have been executed) the semi-conductor components are subjected to further test procedures at one or several (further) test stations—for instance the components—still present on the wafer and completed—may be tested with the help of corresponding (further) test apparatuses ("disk tests").

In similar fashion several further tests may be performed (at corresponding further test stations and by using additional corresponding test equipment) e.g. after the semi-conductor components have been installed in corresponding semi-conductor-component housings, and/or e.g. after the semi-conductor component housings (together with the semi-conductor components installed in them) have been installed in corresponding electronic modules (so-called "module tests").

During the testing of the semi-conductor components (e.g. during the above disk tests, module tests, etc.), so-called DC tests and/or e.g. so-called AC tests may be applied as test procedures.

During a DC test for instance a voltage (or current) at a specific—in particular a constant—level may be applied to a corresponding connection of a semi-conductor component to be tested, whereafter the level of the—resulting—currents (and/or voltages) is measured—in particular tested to see whether these currents (and/or voltages) fall within predetermined required critical values.

During an AC test in contrast, voltages (or currents) at varying levels, particularly corresponding test pattern signals, can for instance be applied to the corresponding connections of a semi-conductor component, with the help of which appropriate function tests may be performed on the semi-conductor component in question.

With the aid of above test procedures, defective semi-conductor components and/or modules can be identified and then eliminated (or else partially repaired), and/or the process parameters—used during the manufacture of the components in each case—can be appropriately modified and/or optimized in accordance with the test results achieved, etc., etc.

In case of a plurality of applications—e.g. at server or work station computers, etc., etc.—memory modules with data buffer components (so-called buffers) connected in series, e.g. so-called "buffered DIMMs", may be installed.

Memory modules of this nature generally contain one or several semi-conductor memory components, particularly DRAMs, (e.g. DDR-DRAMs) as well as one or several data buffer components (e.g. corresponding DDR-DRAM data buffer components as standardized by Jedec)—connected in series before the semi-conductor memory components.

These data buffer components may for instance be installed on the same printed circuit board (card) as the DRAMs.

The memory modules are connected—particularly by interconnecting a corresponding memory controller (e.g. arranged externally to the memory module in question)—with one or several micro-processors of that particular server or work station computer, etc.

In "partially" buffered memory modules the address and control signals—e.g. those emitted by the memory controller, or by the processor in question—may be (briefly) buffered by corresponding data buffer components, and correspondingly similar address and control signals may be relayed—in chronologically co-ordinated, or where appropriate, in de-multiplexed fashion—to the memory components, e.g. DRAMs.

In contrast, the (useful) data signals—emitted by the memory controller and/or by the respective processor—may be relayed directly—i.e. without being buffered by a corresponding data buffer component (buffer)—to the memory components (and—conversely—the (useful) data signals emitted by the memory components may be directly relayed to the memory controller and/or the respective processor).

In "fully buffered" memory modules in contrast, the address and control signals exchanged between the memory controller (and/or the respective processor), and the memory components, and also the corresponding (useful) data signals can first be buffered by corresponding data buffer components, and only then relayed to the memory components and/or the memory controller (or to the respective processor).

For storing the data, especially corresponding test (result) data generated during the above test procedures (or any other test procedure), suitable special test data registers may be provided on the semi-conductor components tested in each case (e.g. on the above analog and/or digital computing circuits, or on the above semi-conductor memory components (PLAs, PALs, ROMs, RAMs, especially SRAMs and DRAMs, e.g. DDR-DRAMs, etc.).

The test data stored in the respective test data registers can be read from the test data registers by applying a corresponding special test data read control signal and corresponding address signals.

The above special test data read control signal has the effect that—in contrast with the use of an ordinary read signal—it is not the memory cells provided in the normal (useful data) memory region of the respective semi-conductor component that are being addressed with the help of the above address signal, but rather corresponding test data registers exactly specified by the relevant address signal.

If, for example, the above buffered memory modules ("buffered DIMMs") are subjected to an appropriate module test, the problem could occur that the above test data read control signal would not be supported by the protocol of the respective data buffer components used.

This has the effect that test (result) data stored on the test data registers of each semi-conductor memory component may not be able to be emitted.

A correspondingly similar problem may occur when corresponding test data—from an external source—needs to be input.

SUMMARY OF THE INVENTION

The invention is aimed at providing a novel semi-conductor component, as well as a novel process for the in- and/or output of test data and/or semi-conductor component control data.

In one embodiment of the invention, there is a process for the in- and/or output of test data and/or semi-conductor component operating control data into or from a semi-conductor component is made available, whereby the semi-conductor component comprises one or several useful data memory cells for storing useful data, and one or several test data registers for storing test data and/or semi-conductor component operating control data, whereby the process comprises:

applying a control signal to the semi-conductor component for switching over the semi-conductor component from a first to a second operating mode; and
applying an address signal to the semi-conductor component, whereby in the second operating mode one or more of the test data and/or semi-conductor component operating control data registers of the semi-conductor component is addressed by the address signal, and in the first operating mode, one or more of the useful data memory cells.

Advantageously, in the second operating mode the address space of the test data and/or semi-conductor component operating control data register(s) is mapped in the address space of the useful data memory cell(s).

In this embodiment, the output of test data and/or semi-conductor component operating control data from the test data and/or semi-conductor component operating control data storage register of the semi-conductor can be achieved by means of a (standard) read command signal (especially by means of a "read" and/or "standard read" signal) and/or that the input of test data and/or semi-conductor component operating control data in the test data and/or semi-conductor component operating control data storage register of the semi-conductor can be achieved by means of a (standard) write instruction signal (especially by means of a "write" and/or "standard write" signal, even when a data buffer component (buffer), not supporting proprietary direct test data input and/or output control signals, were to be connected in series in front of the semi-conductor component).

BRIEF DESCRIPTION OF THE DRAWINGS

Below, the invention is more closely of described by means of exemplary embodiments with reference to the attached drawings. In the drawings:

FIG. 4 shows the principle of the address mapping used during the test data in- and/or output procedure.

DETAILED DESCRIPTION OF THE INVENTION

Figure 1:
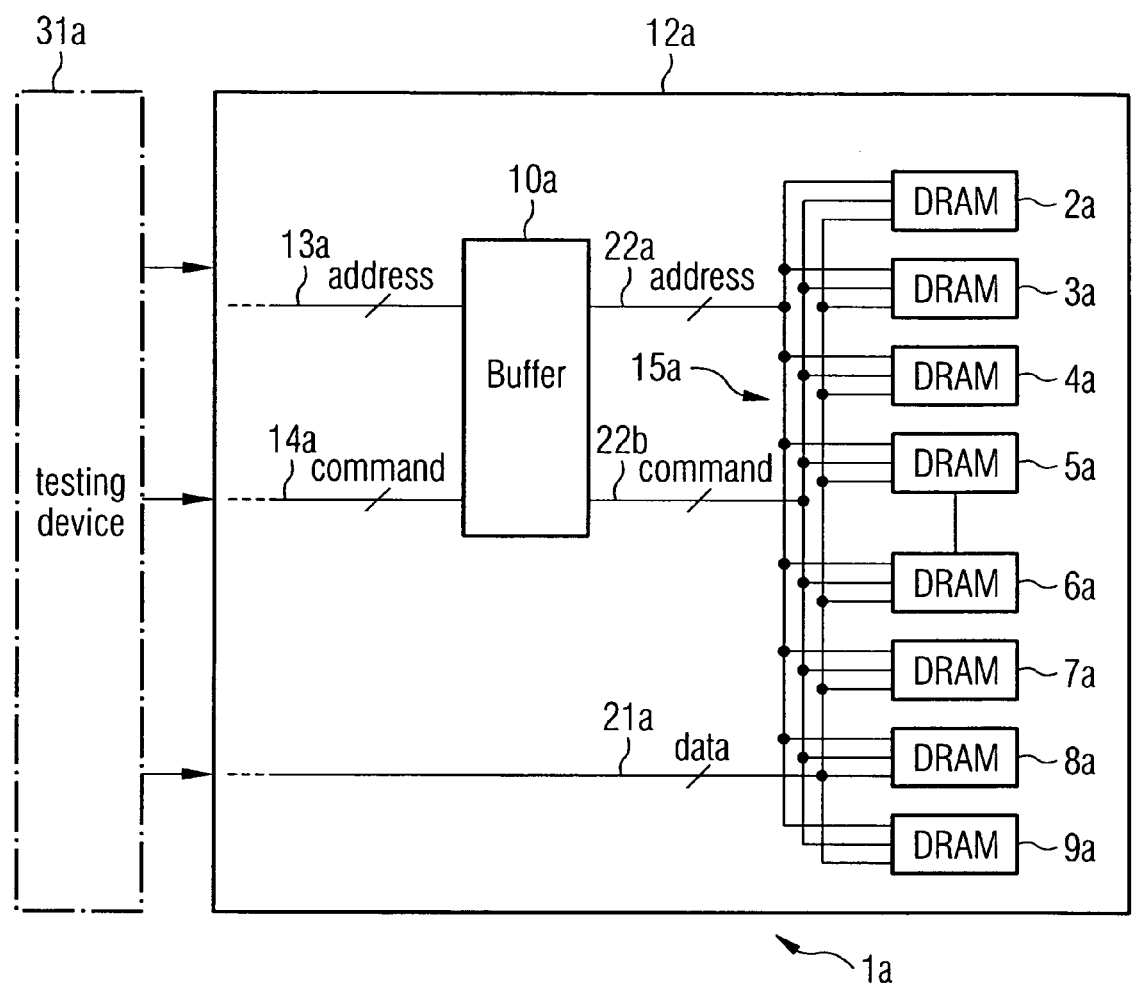
FIG. 1 shows a partially buffered memory module, with corresponding memory components and corresponding data buffer components.

In FIG. 1 a schematic representation of a "partially" buffered memory module 1a is shown (here: a "buffered DIMM" 1a), in which—as an example—a test data in- and/or output procedure in terms of an embodiment example of the invention can be used.

As is apparent from FIG. 1, the memory module 1a illustrated there comprises a plurality of memory components 2a, 3a, 4a, 5a, 6a, 7a, 8a, 9a, and—connected in series in front of the memory components 2a, 3a, 4a, 5a, 6a, 7a, 8a, 9a—one or several data buffer components ("buffers") 10a.

The memory components 2a, 3a, 4a, 5a, 6a, 7a, 8a, 9a may be function memory or table memory components (e.g. ROMs or RAMs), especially DRAMs, e.g. DDR and/or DDR2-DRAMs, etc.

As is apparent from FIG. 1, the memory components 2a, 3a, 4a, 5a, 6a, 7a, 8a, 9a may be arranged on the same printed circuit board 12a as the buffer 10a.

The buffers 10a may for instance be appropriate Jedec-standardized ("registered DIMM") DRAM, especially DDR-DRAM, and/or DDR2-DRAM data buffer components.

The memory module 1a may be connected with one or more micro-processors (not shown here)—especially by interconnecting a corresponding memory controller (e.g. arranged externally to the memory module 1a, in particular arranged externally to the above printed circuit board 12a)—especially with one or more micro-processors of a server or workstation computer (or any other micro-processor, e.g. of a PC, laptop, etc.).

As is apparent from FIG. 1, the address and control signals at the partially buffered memory module 1a shown there—e.g. those emitted by the memory controller, or the respective processor—are not directly relayed to the memory components 2a, 3a, 4a, 5a, 6a, 7a, 8a, 9a.

Instead, the address signals are first led—e.g. via a corresponding address bus 13a (and/or corresponding address lines)—and the control signals—e.g. via a corresponding control bus 14a (and/or corresponding control lines)—to the buffers 10a.

The control signals may be any suitable control signals such as used in conventional memory modules, e.g. corresponding read and/or write, and/or chip select (memory component selection) command signals, etc., etc, insofar as they are supported by the protocol of the buffers 10a.

In the buffers 10a the corresponding signals (address signals, control signals) are—briefly—buffered, and relayed—in a chronologically co-ordinated, and where needed in multiplexed or de-multiplexed fashion—to the memory components 2a, 3a, 4a, 5a, 6a, 7a, 8a, 9a (e.g. via a corresponding—central—memory bus 15a—(with a suitable control and address bus 22a, 22b with corresponding control and address lines)).

With the partially buffered memory module 1a shown in FIG. 1 in contrast, the (useful) data signals—e.g. those emitted by the above memory controller or by the processor in question—can be relayed directly—i.e. without being buffered by a corresponding data buffer component (buffer)—to the memory components 2a, 3a, 4a, 5a, 6a, 7a, 8a, 9a (e.g. via a (useful) data bus 21a (and/or corresponding (useful) data lines) directly connected with the above central memory bus 15a).

Correspondingly inverted, the (useful) data signals—emitted by the memory components 2a, 3a, 4a, 5a, 6a, 7a, 8a, 9a—can also be relayed directly—without a corresponding data buffer component (buffer) being connected in series in front of it—to the memory controller and/or to the respective processor (e.g. again via the above (useful) data bus 21a, which is directly connected with the central memory bus 15a).

Figure 2:
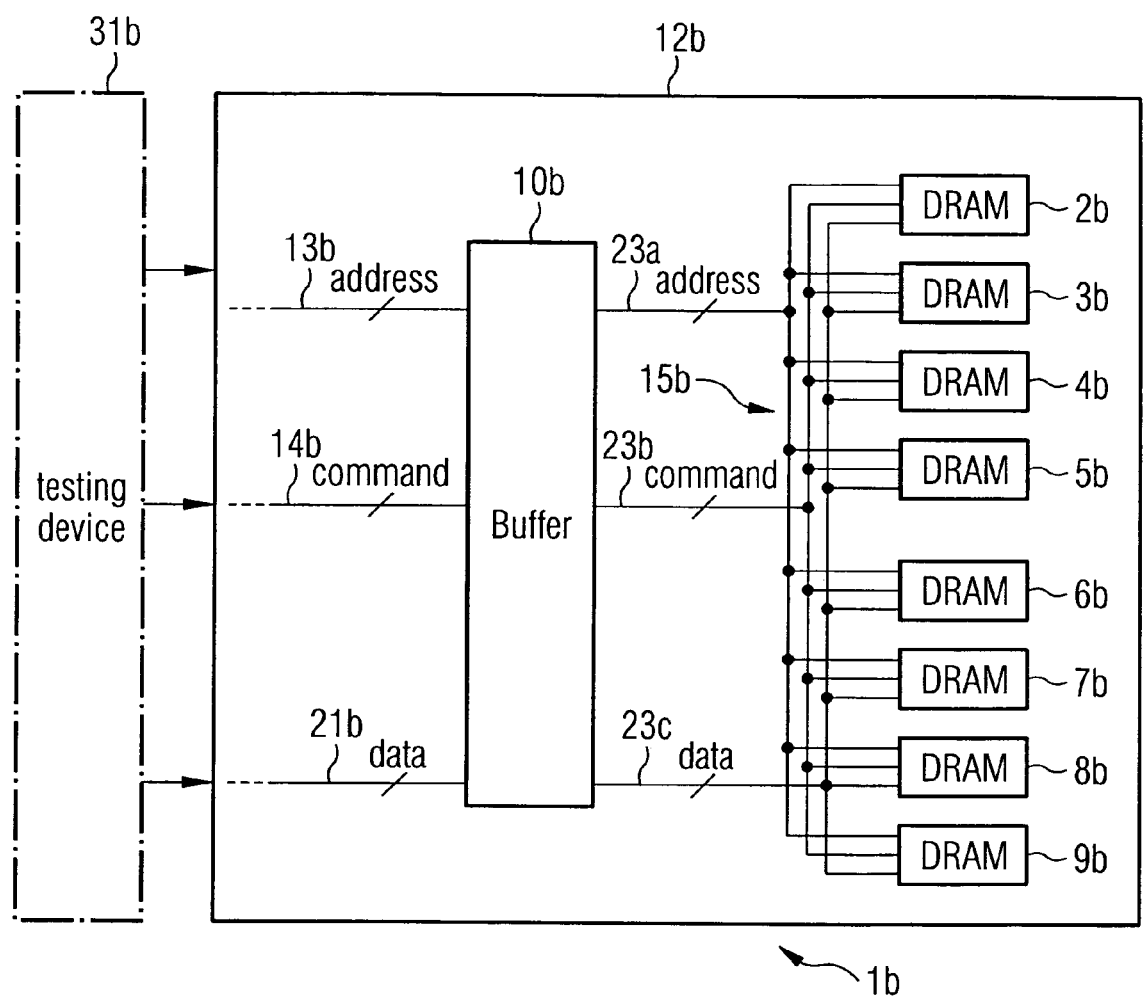
FIG. 2 shows a fully buffered memory module, with corresponding memory components, and corresponding data buffer components.

In FIG. 2 a schematic representation of a fully buffered memory module 1b (here: a "buffered DIMM" 1b) is shown, in which the above test data input/output procedure—more closely described below—can—similarly—be used in terms of an embodiment example of the invention.

As is apparent from FIG. 2, the memory module 1b shown there comprises—corresponding with the partially buffered memory module 1a as in FIG. 1—a plurality of memory components 2b, 3b, 4b, 5b, 6b, 7b, 8b, 9b, and one or more data buffer components ("buffers") 10b connected in series in front of the memory components 2b, 3b, 4b, 5b, 6b, 7b, 8b, 9b.

The memory components 2b, 3b, 4b, 5b, 6b, 7b, 8b, 9b may for instance be function memory or table memory components (e.g. ROMs or RAMs), especially DRAMs, e.g. DDR and/or DDR2-DRAMs, etc.

As is apparent from FIG. 2, the memory components 2b, 3b, 4b, 5b, 6b, 7b, 8b, 9b may be arranged on the same printed circuit board 12b as the buffer 10b.

The buffers 10b may be corresponding standardized DRAM, especially DDR-DRAM and/or DDR2-DRAM data buffer components (e.g. "fully buffered" data buffer components standardized by a consortium under leadership of Intel in conjunction with Jedec (e.g. FB-DIMM and/or fully buffered DIMM data buffer components)).

The memory module 1b may be connected (correspondingly similar to the memory module 1a shown in FIG. 1a)—in particular with a corresponding memory controller (not shown here and e.g. arranged externally to the memory module 1b, in particular arranged externally to the above printed circuit board 12b) connected in series above it—with one or several micro-processors, particularly with one or several micro-processors of a server or work station computer (or any other suitable micro-processor, e.g. of a PC, laptop, etc.).

As is apparent from FIGS. 1 and 2, the memory module 1b shown in FIG. 2 is correspondingly similarly and/or identically constructed, and operates similarly or identically to, the memory module 1a shown in FIG. 1, except that with the buffer 10b—correspondingly similar to conventional fully buffered memory modules)—the (useful) data signals exchanged between the memory controller and/or the respective processor, and the memory components 2b, 3b, 4b, 5b, 6b, 7b, 8b, 9b are (in addition to the similarly buffered control—and address—signals in the memory module 12a shown in FIG. 1) also buffered.

In buffer 10b the corresponding data signals, e.g. those deriving from the memory controller and/or the respective processor, for instance relayed via a data bus 21b, can be—briefly—buffered and relayed in a chronologically co-ordinated, or where appropriate, in a multiplexed or de-multiplexed fashion to the memory components 2b, 3b, 4b, 5b, 6b, 7b, 8b, 9b (e.g. via a—central—memory bus 15b (with a corresponding control, address and data bus 23a, 23b, 23c with corresponding control, address and/or data lines) corresponding with the above central bus 15a described in relation to FIG. 1)).

In the buffer 10b, the corresponding data signals, e.g. deriving from the respective processor and e.g. relayed via a data bus 21b can be—briefly—buffered and relayed—in a chronologically co-ordinated and where needed, in a multiplexed or de-multiplexed fashion—to the memory components 2b, 3b, 4b, 5b, 6b, 7b, 8b, 9b (e.g. via a—central memory bus 15b (corresponding with the central data bus 15a, described in relation with FIG. 1 above) with a corresponding control, address and data bus 23a, 23b, 23c with corresponding control, address and data lines.

Correspondingly inverted, the data signals emitted by the memory components 2b, 3b, 4b, 5b, 6b, 7b, 8b, 9b, for instance to the central memory bus 15b, are—briefly—buffered and relayed—in a chronologically co-ordinated and where needed, in a multiplexed or de-multiplexed fashion—to the memory controller and/or to the respective processor, for instance via the above data bus 21b.

Figure 3:
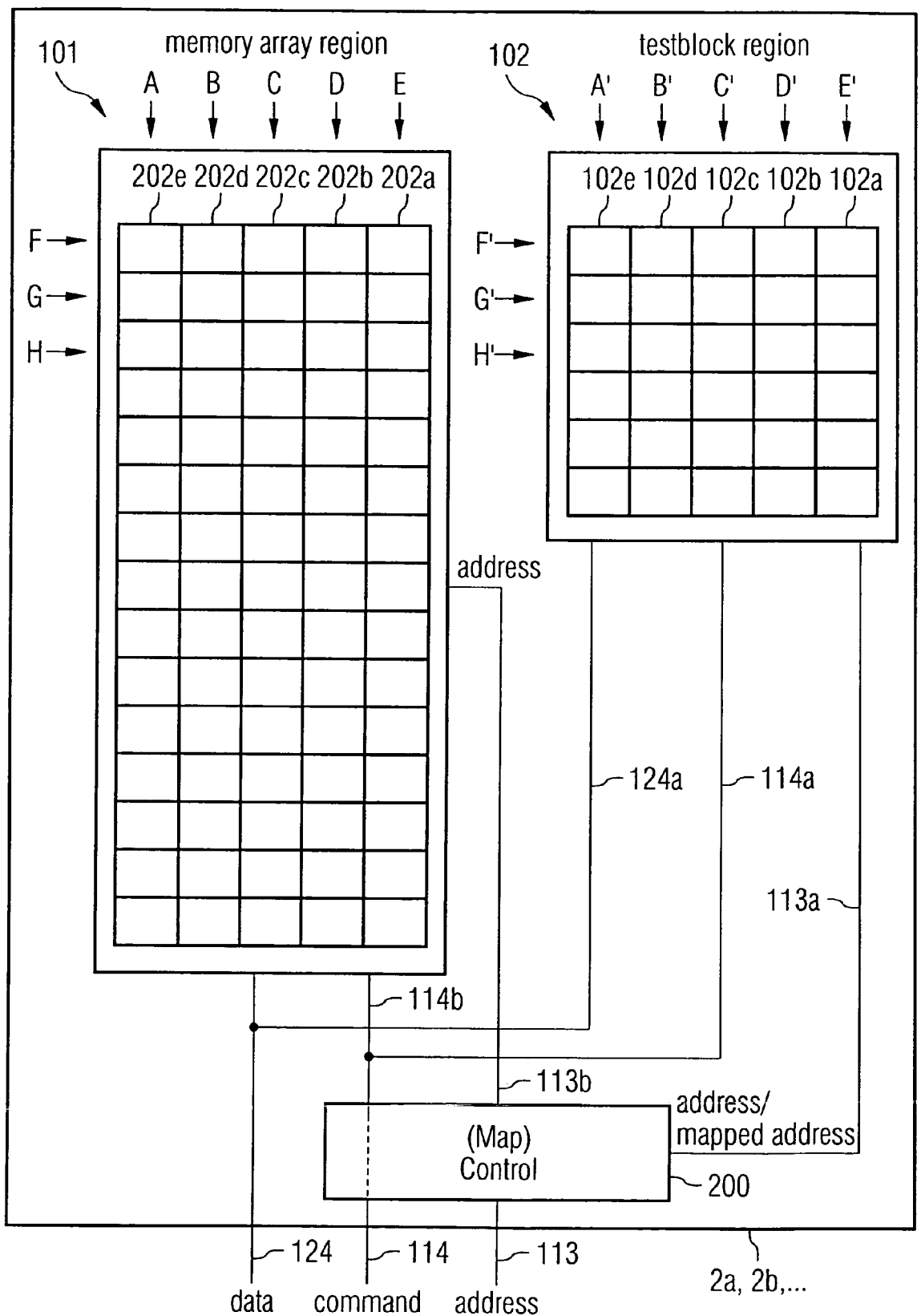
FIG. 3 shows a section of one of the memory components shown in FIGS. 1 and 2 as an example, in order to illustrate a test data in- and/or output procedure in terms of an embodiment example of the invention.

FIG. 3 shows—as an example—a schematic detailed representation of a section of the memory components 2a, 3a, 4a, 5a, 6a, 7a, 8a, 9a, 2b, 3b, 4b, 5b, 6b, 7b, 8b, 9b shown in FIGS. 1 and 2.

The components may—as is apparent from FIG. 3 (and corresponding with conventional memory components, especially DRAMs)—contain one or more memory array regions 101 and/or memory fields, as well as one or more test block regions 102.

In the memory array area 101 one or several rectangular memory arrays and/or memory matrixes ("memory banks") can be provided.

Each memory array and/or each memory matrix may in each case contain a plurality of memory cells, 202a, 202b, 202c, 202d, 202e, which may in each case be arranged in a plurality of rows F, G, H and columns A, B, C, D, E lying adjacent to each other, so that e.g. more than 16 Mbit, e.g. 32 MBit, 64 MBit, 128 MBit, 256 MBit, etc., or more of data may be stored in each memory array (so that accordingly—with for instance four memory arrays—a total memory capacity of e.g. more than 64 Mbit, e.g. 128 MBit, 256 MBit, 512 MBit, 1,024 MBit (and/or 1 GBit) or more is accordingly created for the memory component).

As is further apparent from FIG. 3a, the memory array area 101 is connected via corresponding lines 114b, 114 (and where appropriate, with the control device, especially a mapping control device 200 connected in series before it) with the above control bus 22b, 23b (and thereby also with the above control bus 14a, 14b) and via corresponding lines 113b, 113 with the above address bus 22a, 23a (with the control device, especially a mapping control device 200 connected in series before it) (and thereby also with the above address bus 13a, 13b).

Furthermore the memory array area 101 is connected with the above data bus 21a, 23c (and thereby also with the above data bus 21b) via the corresponding lines 124.

In this way it is achieved—during normal operation and/or in the normal operating mode of the memory component 2a, 2b—that by applying an appropriate conventional (DRAM) read instruction signal ("Read" (RD), in particular a "Standard Read", especially a normal "Read" (RD), in particular a "Standard Read" signal as specified by Jedec (and/or Intel/Jedec) for the above data buffering memory components 2a, 3a, 4a, 5a, 6a, 7a, 8a, 9a, 2b, 3b, 4b, 5b, 6b 7b, 8b, 9b) to the above lines 114 (which signal is relayed by the above control device 200 to the above lines 114b in unchanged and/or essentially unchanged form)—the data stored in the memory cells 202a, 202b, 202c, 202d, 202e of the memory array area 101 specified by a suitable address signal applied to lines 113 (which signal is relayed in unchanged or essentially unchanged form by the control device 200 to lines 113b (not, however to lines 113a) can be read from the array in question and emitted to the above lines 124 connected with the above data bus 21a, 23c.

In correspondingly similar fashion—during the normal operation and/or in the normal operational mode of the memory components 2a, 2b—data present on the above lines 124, may be stored in memory cells 202a, 202b, 202c, 202e—specified by applying an appropriate address signal to the lines 113 (relayed to the lines 113b (not however to the lines 113a) in unchanged and/or essentially unchanged form by the control device 200) by applying a corresponding conventional (DRAM) write command signal ("Write" (WT), in particular "Standard Write", especially a normal "Write" (WT), especially a "Standard Write" signal specified by Jedec (and/or by Intel/Jedec) for the above data buffering memory components 2a, 3a, 4a, 5a, 6a, 7a, 8a, 9a, 2b, 3b, 4b, 5b, 6b 7b, 8b, 9b) to the above lines 114 (which signal is relayed to the above lines 114b in unchanged or essentially unchanged form by the control device 200).

The above write command, read command and address signals etc. may for instance—as already indicated above—be conveyed to the buffers 10a, 10b by the above memory controller and/or by the respective processor via the above control and address buses 13a, 13b, 14a, 14b—briefly—buffered, and relayed—in a chronologically co-ordinated fashion—to the memory components 2a, 2b, etc. via the above control and address buses 22a, 23a, 22b, 23b.

The above address signal may for instance consist of row and column address signals (e.g. emitted in succession via the above lines 113 (and/or the address bus 13a, 13b 22a, 23a)), whereby in each case a corresponding row in the memory cells 202a, 202b, 202c, 202d, 202e arranged to lie in the rows F, G, H and columns A, B, C, D, E, is for instance identified by the row address signal, and in each case a corresponding column of the memory cells 202a, 202b, 202c, 202d, 202e arranged to lie in the rows F, G, H and columns A, B, C, D, E is identified by the column address signal—thereby in consolidated form a particular memory cell (allocated to the corresponding row and column) is identified in each case by the row and column address signal.

The number of bits of the row address signal is selected according to the number of memory cell rows F, G, H, and the number of bits of the column address signal according to the number of memory cell columns A, B, C, D, E (so that in each case any one of the memory cells 202a, 202b, 202c, 202d, 202e lying in the above memory cell area 101 can be addressed by the above address signal (consisting of a row and a column address signal) (the above memory cells 202a, 202b, 202c, 202d, 202e therefore lie together in the above memory array area "address space" definable by the above address signal).

In order to perform appropriate test procedures, especially corresponding module tests, appropriate test apparatuses 31a, 31b—as indicated in FIG. 1 and FIG. 2—may be connected to the above memory modules/circuit boards 1a, 1b/12a 12b, instead of the above memory controller/processor.

For test purposes these test apparatuses—correspondingly similar to the above memory controller/processor—can convey corresponding (test) control, (test) address and useful (test) data signals via the above control, address and (useful) data buses 13a, 13b, 14a, 14b, 21a, 21b, to the above buffers 10a, 10b (and thereby to the above memory components 2a, 3a, 4a, 5a, 6a, 7a, 8a, 9a, 2b, 3b, 4b, 5b, 6b, 7b, 8b, 9b) (and receive corresponding useful (test) data signals from the buffers 10a, 10b (and thereby from the memory components 2a, 3a, 4a, 5a, 6a, 7a, 8a, 9a, 2b, 3b, 4b, 5b, 6b, 7b, 8b, 9b)).

In order to store the data, especially corresponding test result data, generated by the test procedures executed by the test apparatuses 31a, 31b (e.g. corresponding AC or DC tests, or any other test procedure), and/or to store the test data and/or corresponding component operating control data used or needed in the procedures executed by the above test apparatuses 31a, 31b for testing the memory components 2a, 3a, 4a, 5a, 6a, 7a, 8a, 9a, 2b, 3b, 4b, 5b, 6b, 7b, 8b, 9b—corresponding special test and/or component operating data registers 102a, 102b, 102c, 102d 102e—e.g. as shown in FIG. 3a—may be provided in the test block regions of the memory components 2a, 3a, 4a, 5a, 6a, 7a, 8a, 9a, 2b, 3b, 4b, 5b, 6b, 7b, 8b, 9b tested in each case (e.g. between 1 and 100, especially e.g. between 2 and 50 test data registers, etc.).

With the above component operating control data—in the above normal operating mode and/or in a test operating mode (more closely of described below)—corresponding voltages, used internally in the memory component 2a, and/or the timing (chronological) behavior of the memory component 2a can be adjusted; alternatively or additionally (a part of) the control data can for instance also be used for e.g. chip-specific identification, etc., etc.

The test data registers 102a, 102b, 102c, 102d, 102e can for instance always be arranged into a plurality of rows F', G', H' and columns A', B', C', D', E' lying adjacent to each other (or in any other fashion, whereby the test data registers 102a, 102b, 102c, 102d, 102e can then in each case be "virtually" allocated to corresponding "virtual" rows F', G', H' and "virtual" columns A', B', C', D', E'). The number of rows F', G', H' and/or columns A', B', C', D', E' of test data registers 102a, 102b, 102c, 102d, 102e can be smaller, in particular substantially smaller, than the number of rows F, G, H and/or columns A, B, C, D, E of the above (useful data) memory cells 202a, 202b, 202c, 202d, 202e provided in the memory array area 101 (for instance (in comparison with the memory cell rows and/or columns) less than half, one eighth or one sixty-fourth etc. of (actual or "virtual") test data register rows F', G', H' and/or columns A', B', C', D', E' can be provided).

As is apparent from FIG. 3a, the test block area 102 is connected with the control bus 22b, 23b (and thereby also with the control bus 14a, 14b) via corresponding lines 114a and the above lines 114 (and where needed with the control device, in particular the mapping control device 200, connected in series before it), and (with the control device, in particular the mapping control device 200, connected in series before it) via the lines 113a and the above lines 113 with the above address bus 22a, 23a (and thereby also with the above address bus 13a, 13b).

In addition the test block area 102 is connected via corresponding lines 124a, and the above lines 124, with the above address bus 21a, 23c (and thereby also with the above data bus 21b).

In order to read the test data and/or component operating control data into or from the above test data registers 102a, 102b, 102c, 102d, 102e of the test block area 102, the corresponding memory component 2a, 3a, 4a, 5a, 6a, 7a, 8a, 9a, 2b, 3b, 4b, 5b, 6b, 7b, 8b, 9b is brought from the above normal operating mode ("normal mode") into the test operating mode ("test mode") which has already been briefly described above.

To achieve this, a suitable special test operating mode start command signal is applied to the above lines 114 (and/or—alternatively—to the above lines 114, and to the above lines 113 and/or to part of the above lines 113) (for instance a special Bit combination is applied to the lines 114, and/or—simultaneously to this—a special Bit combination is applied to the lines above 113 and/or part of the lines 113).

The test operating mode start command can be relayed to the buffers 10a, 10b by the above test apparatus 31a, 31b via the above control bus or the control and the above address bus 13a, 13b, 14a, 14b—briefly—buffered and then—in a chronologically co-ordinated fashion—transferred via the above control bus or the control and address bus 22a, 23a, 22b, 23b, to the memory components 2a, 2b, etc.

As is apparent from FIG. 3, the control device 200 monitors the signals present on lines 114/113. If the control device 200 determines that a corresponding test operating mode start command signal is present on lines 114/113, the control device 200—as is more closely described below—causes the corresponding memory component 2a, 3a, 4a, 5a, 6a, 7a, 8a, 9a, 2b, 3b, 4b, 5b, 6b, 7b, 8b, 9b to be brought from the above normal operating mode into the above test operating mode.

In the test operating mode—as schematically illustrated in FIG. 4—the address space of the test data registers 102a, 102b, 102c, 102d, 102e of the test block area 102 is mapped in the above address space of the above (useful data) memory cells 202a, 202b, 202c, 202d, 202e of the memory array area 101.

By means of an address signal applied to the lines 113, a corresponding test data register 102a, 102b, 102c, 102d, 102e of the test block area 102 is then specified in the test operating mode, instead of—as in the normal operating mode—a corresponding memory cell 202a, 202b, 202c, 202d, 202e of the memory array area 101.

More accurately, a row address signal of a corresponding address signal, instead of—in the normal operating mode—identifying a corresponding row F, G, H of the memory cells 202a, 202b, 202c, 202d, 202e of the memory array area 101, in the test operating mode then identifies a corresponding (actual and/or virtual) row F', G', H' of the test data registers 102a, 102b, 102c, 102d, 102e of the test block area 102, while a column address signal identifying a corresponding column A, B, C, D, E of the memory cells 202a, 202b, 202c, 202d, 202e of the memory array area 101 in the normal operating mode, in the test operating mode then instead identifies a corresponding (actual and/or virtual) column A', B', C', D', E' of the test data registers 102a, 102b, 102c, 102d, 102e of the test block area 102.

A row address signal—in the normal operating mode—for instance identifying row F of the memory array area 101 can—in the test operating mode—instead of this for instance identify row F' of the test block area 102; a row address signal—in the normal operating mode—for instance identifying row G of the memory array area 101 can—in the test operating mode—instead of this for instance identify the row G' of the test block area 102, etc. etc.; in corresponding fashion for instance, a column address signal—in the normal operating mode—for instance identifying column A of the memory array area 101, can—in the test operating mode—instead of this for instance identify column A' of the test block area 102; a column address signal—in the normal operating mode—identifying column B of the memory array area 101 can—in the test operating mode—instead of this for instance identify column B' of the test block area 10, etc., etc. (and thereby an address signal (consisting of for instance column and row address signals emitted in succession via the above lines 113 (and/or via the address bus 13a, 13b, 22a, 23a))—in the normal operating mode—for instance identifying memory cell 202a, can—in the test operating mode—instead of this for instance identify the test data register 102a; an address signal—in the normal operating mode—for instance identifying the memory cell 202b can—in the test operating mode—instead of this for instance identify the test data register 102b, etc., etc.).

Reading test data and/or semi-conductor operating control data from the above test data registers 102a, 102b, 102c, 102d, 102e of the test block area 102 can then—after the corresponding memory component 2a, 3a, 4a, 5a, 6a, 7a, 8a, 9a, 2b, 3b, 4b, 5b, 6b, 7b, 8b, 9b has been brought from the normal operating mode into the test operating mode in the above fashion—be done by a corresponding conventional (DRAM) read command signal ("Read" (RD), in particular a "standard read", especially a "Read" (RD), in particular a "Standard Read" signal as specified by Jedec and/or Intel/Jedec for the above data buffer components 2a, 3a, 4a, 5a, 6a, 7a, 8a, 9a, 2b, 3b, 4b, 5b, 6b, 7b, 8b, 9b) being applied to the lines 114 (which signal is relayed by the control device 200 in unchanged or essentially unchanged form to lines 114a); then the test data and/or semi-conductor operating control data stored in the test data registers 102a, 102b, 102c, 102d, 102e of the test block area 102 specified by a corresponding address signal applied to lines 113 (relayed by control device 200—as opposed to when in the normal operating mode—unchanged or essentially unchanged to lines 113a, not however to corresponding lines 113b) is read and emitted to the above lines 124 connected with the above data bus 21a, 23c (and relayed to the test apparatus 31a, 31b).

In correspondingly similar fashion—in the test operating mode of the memory components 2a, 2b—reading test data and/or semi-conductor operating control data into the above test data register 102a, 102b, 102c, 102d, 102e of the test block area 102 can be achieved by an appropriate conventional (DRAM) write command signal ("Write" (WT),—in particular a "Standard Write"—signal, in particular one specified by Jedec and/or Intel/Jedec for the above data buffer components 2a, 3a, 4a, 5a, 6a, 7a, 8a, 9a, 2b, 3b, 4b, 5b, 6b, 7b, 8b, 9b) being applied to the lines 114 (which signal is relayed by the control device 200 in unchanged or essentially unchanged form to lines 114a), whereupon the test data and/or semi-conductor operating control data present on lines 124 (relayed by the test apparatus 31a, 31b) is stored in the test data registers 102a, 102b, 102c, 102d, 102e of the test block area 102 specified by a corresponding address signal applied to lines 113 (relayed by control device 200—as opposed to when in the normal operating mode—in unchanged or essentially unchanged form to lines 113a, not however to lines 113b).

The above Write command, Read command and address signals, etc. can be transferred by the above test apparatus 31a, 31b via the above control and address buses 13a, 13b, 14a, 14b to buffers 10a, 10b—briefly—buffered, and relayed—in chronologically co-ordinated fashion—via the above control and address buses 22a, 23a, 22b, 23b to the memory components 2a, 2b, etc.

By means of the procedure described above it can be achieved that the test data and/or semi-conductor operating control data stored in the test data registers 102a, 102b, 102c, 102d, 102e can be read out from these registers and relayed to the appropriate test apparatus 31a, 31b, and/or that corresponding test data and/or semi-conductor operating control data can be transferred from the test apparatus 31a, 31b to the test data registers 102a, 102b, 102c, 102d, 102e and read into these, even when the above buffers 10a, 10b do not support corresponding direct proprietary test data output and/or input control signals.

In order to return the corresponding component 2a, 3a, 4a, 5a, 6a, 7a, 8a, 9a, 2b, 3b, 4b, 5b, 6b, 7b, 8b, 9b to the above normal operating mode, a special test operating mode terminating command signal can be applied—for instance by the test apparatus 31a, 31b—to the above lines 114 (and/or—alternatively—to the above lines 114 and the above lines 113 and/or part of the above lines 113) (e.g. a (further) special Bit combination can be applied to the above lines 114, and/or—simultaneously—a (further) special Bit combination to the above lines 113 and/or to a part of lines 113), etc.

What is claimed is:

1. A process for inputting and/or outputting test data and/or semi-conductor component operating control data into or from a semi-conductor component, whereby the semi-conductor component comprises one or more useful data memory cells for storing useful data, and one or more test data and/or semi-conductor component operating control data registers for storing test data and/or semi-conductor component operating control data, comprising:
    applying a control signal to the semi-conductor component for switching over the semi-conductor component from a first to a second operating mode; and
    applying an address signal to the semi-conductor component, wherein in the second operating mode one or more of the test data and/or semi-conductor component operating control data registers of the semi-conductor component is addressed by the address signal, and in the first operating mode one or more of the useful data memory cells.

2. The process according to claim 1, wherein in the second operating mode an address space of the test data and/or semi-conductor component operating control data register(s) is mapped in an address space of the useful data memory cell(s).

3. The process according to claim 1, further comprising:
    entering or reading test data and/or semi-conductor component operating control data into or from the register(s) addressed by the address signal.

4. The process according to claim 1, wherein the first operating mode is a normal operating mode, and the second operating mode a test operating mode.

5. The process according to claim 1, wherein the semi-conductor component comprises a plurality of useful data memory cells arranged in a memory array area.

6. The process according to claim 1, wherein the semi-conductor component comprises a plurality of test data and/or semi-conductor component operating control data registers arranged in a test block area.

7. The process according to claim 1, wherein the semi-conductor-component is a memory component.

8. The process according to claim 7, wherein the semi-conductor component is a RAM.

9. The process according to claim 7, wherein test data generated during the testing of the semi-conductor component and/or used for the testing of the semi-conductor component is stored in the one or more test data and/or semi-conductor component operating control data registers.

10. A semi-conductor component, comprising:
    a plurality of useful data memory cells for storage of useful data;
    a plurality of test data and/or semi-conductor component operating control data registers for the storage of test data and/or semi-conductor component operating control data;
    a device for mapping an address space of the test data and/or semi-conductor component operating control data registers in an address space of the useful data memory cells.

* * * * *